United States Patent [19]

Utzerath

[11] 4,145,754
[45] Mar. 20, 1979

[54] LINE SEGMENT VIDEO DISPLAY APPARATUS

[76] Inventor: James Utzerath, 12024 W. Kaul Ave., Milwaukee, Wis. 53225

[21] Appl. No.: 695,100

[22] Filed: Jun. 11, 1976

[51] Int. Cl.$^2$ .............................................. G06F 3/14
[52] U.S. Cl. .................................. 364/900; 340/749; 340/706; 340/750
[58] Field of Search ........ 340/172.5, 324 A, 324 AD, 340/15.5 DS, 324 M; 445/1; 364/200 MS File, 900 MS File; 315/267, 367, 379, 380; 358/152

[56] References Cited

U.S. PATENT DOCUMENTS

| Re. 29,550 | 2/1978 | Bantner | 340/324 AD |
|---|---|---|---|
| 3,593,310 | 7/1971 | Kievit | 340/172.5 |
| 3,680,076 | 7/1972 | Duffek et al. | 340/324 AD |
| 3,815,104 | 6/1974 | Goldman | 340/172.5 |
| 3,891,982 | 6/1975 | Cheek et al. | 340/324 AD |
| 3,894,292 | 7/1975 | Wilkinson et al. | 340/324 AD |
| 3,895,357 | 7/1975 | Schwartz et al. | 340/172.5 |
| 3,911,404 | 10/1975 | O'Neill | 340/172.5 |
| 3,958,225 | 5/1976 | Turner et al. | 340/172.5 |
| 4,090,187 | 5/1978 | Kreinik | 340/324 AD |

*Primary Examiner*—Mark E. Nusbaum
*Attorney, Agent, or Firm*—Andrus, Sceales, Starke & Sawall

[57] ABSTRACT

A raster typ display apparatus includes interlaced even-and-odd frames. A digital memory of a computer stores line segment data in locations which are sequentially read out to form a line segment display with overlapping line segments. The first line of one field is defined by a "0" start location and a third removed location for the end. The second line is defined by the fourth and seventh locations, and so forth. The first line of the second field starts with the last data taken plus two to access and define the line by the second and fifth locations, and so forth. The first field again reads the start to third locations, fourth to seventh, etc. Data points equal to twice the scan lines are displayed with each scan line spread over four data points. An off-scale detector prevents a line segment directly between the data points and creates a pair of line segments at the top and bottom of the display screen. An extended line from a break point in a curve to screen bottom is also prevented. Resettable registers monitor the carrier bits of digital multiplier and adder and are connected by an even-odd detector to actuate an exclusive "OR" gate to complement the output and generate the appropriate split display. A display control assigns a data words as a control which are loaded in memory by the computer. A detection network controls an "ANDED" routing network for coded control of the line segment definition, such as blanking and channel changes.

9 Claims, 4 Drawing Figures

LINE SEGMENT VIDEO DISPLAY APPARATUS

BACKGROUND OF THE INVENTION

The present invention relates to a line segment display apparatus having the display generated by a series of line segments on a raster-type display means.

A continuous, visual presentation of changes in various functions and processes may employ video devices.

A particularly satisfactory apparatus is disclosed in the copending application of Lawrence T. McQuire entitled "MULTI CHANNEL DATA COLOR DISPLAY APPARATUS" filed on July 10, 1974 with Ser. No. 487,010, now U.S. Pat. No. 3,978,470, wherein a multi-channel data color display apparatus includes continuous monitored data and driving a multiple channel display means, with each channel identified by a selected unique color. In one embodiment, a raster-type TV tube is re-oriented to present vertical scan lines with each line formed as a line segment. A computer stores the beginning and end definition of each line segment and the information is read out in proper sequence from successive data locations to activate a color driver which produces a predetermined color presentation in each channel and thereby provides a color-coded presentation.

A conventional television receiver with interlaced sacanning is employed for the graphical display. A sequence controller addresses the memory to provide sequential entry of information into a pair of start and stop registers which are connected to a reading circuit to produce output signals in timed relation to the television receiver synchronizing signal unit and particularly the horizontal and vertical sync signal and the odd and even frame signals. A coordinate counter is driven from the TV sync clock and is reset at the beginning of each scan line. The register number is compared with the counter and when a selected comparison with the first register exists the TV beam driver is driven to illuminate a correspondingly positioned display coordinate of the conventional television set and illumination is maintained until a selected comparision with the second register exists. The sequence then steps the addressing means, one address to load the new start coordinator for the next segment and another address to load the new stop coordinate for the next segment in the pair of registers. In this manner, the unit continuously controls the sequential reading of successive memory locations and the individual coordinates of the respective line segment coordinate in a proper time position in accordance with the sampled data.

Although the line segment display provides a simple and relatively inexpensive video instrument, the stepped, graphical display generated by the reading of successive locations does not provide a waveform, readily and conveniently interpreted. Further, the data presented is, of course, limited by the number of scan lines of the display means, which for a conventional interlaced frame system, is only a total 512 lines. Although such a system is, therefore, a practical instrument, limitations on its use are inherent in the data presentation and the amount of data presented in any given graphical display.

SUMMARY OF THE INVENTION

In accordance with the present invention, the display means includes a raster type display beam with interlaced scanning frames in which the line segments of one frame read between a plurality of data points and a second frame reads between a plurality of data points which are the intervening data samples with the first plurality of data points. The result is a line segment graphical display with overlapping and interlaced line segments. This results in a new and unique presentation of data in which a given number of scanning lines can represent twice that number of data points. This results in a new and different presentation and further may significantly minimize the flicker over an appreciable portion of the graphical display. The visual presentation is significantly improved and appears as a continuous graph.

In a particular embodiment of this invention, the data is stored in consecutive addresses within the memory for read-out and driving of the beam driver. During the one field, the first line is read to include the first storage location as the beginning data point for the line segment and then the third removed data storage location for the ending. The second line segment is read to include the fourth and seventh locations and so forth. On the alternate field retrace, the address counter is loaded with the address of the last sample taken which corresponds to the first data in the stored-in memory and incremented by two. On horizontal drive, the counter is incremented once to access the starting data point for the alternate field and then continues to read the memory for presentation of the graphical data in memory with the line segments of the alternate field overlapped with those of the first field.

The graphical display is thereby a presentation of data points equal to twice the number of scanning lines, with each overlapping scan line presenting the data spread over four data points in this particular embodiment. This provides a new visual presentation of the stored data with improved and more readily interpreted waveform and particularly minimizes the flicker associated with a conventional TV presentation employing line segment display. Thus, in a conventional 512 line TV display, the conventional line segment display includes a distinct 30 Hertz flicker which is significantly eliminated from the present display as a result of the increased number of data points included in the display.

If the data sampled does not provide a distinct starting and stopping data point within a scan line or if the second data point results in an off scale point, the graphical display means generally generates an errorneous display line. Thus, in the presence of an off-scale presentation, the display means generally interprets the off-scale data point as being appropriate to presentation below the upper point and draws the elongated line segment therebetween, rather than drawing of a pair of lines from the top data point upwardly to the top of the display screen where the graphical information is leaving the screen, and then a continuing line from the lower most edge of the screen upwardly to the second data point. Similarly, if there is an interruption in the data curve, an extended line from the terminal point to the lower edge of the screen may be generated. The addition of such lines are undesirable because the display presents information which is not true data, while in the case of off-scale data, excluding data which should be displayed.

In accordance with a further aspect of the present invention, fast and relatively inexpensive control eliminates the display of such erroneous interconnecting lines while maintaining the illustration and display of all data samples. Generally, the accordance with this aspect of the invention, the multiplier and subtracter are monitored on a line-by-line basis by the simple counting system. The count will alwyas be of a selected characteristic whenever a jump line would be created under normal operation. This signal is coupled to a complementing network and if the next data point is off-scale, the modifying network is activated to display all of the line except between the two data samples and thus presents the true data rather than the generation of the extended erroneous jump line. A very simple and particularly practical implementation of this aspect of the present invention, a digital multiplier and a separate digital adder, are cascaded between the memory unit and the display drive means. Multiplication and position constants are set in the corresponding circuit elements. A pair of resettable registers are coupled to each of the elements. In any given line segment, the digital multiplier and adder provide up to two carry bits. If both of the register means are even, an off-scale presentation is indicated with a potential jump-line generation. The output of the registers are connected to an even-odd detector. The even-odd detector is connected to an exclusive OR network connected between the output of the start-stop comparator control of the display means and the driver and serves to complement the output of the comparator control to generate the appropriate split display.

In the analysis of data, the display may be desirably changed for any given channel. For example, in multiple color and channel displays, a color of a given channel may be desirably changed in response to a certain data state. In a multiple-channel, black and white unit, the selected condition could advantageously result in switching to another channel or even blanked.

In accordance with still a further aspect of this invention, the conditions at which such a change is recorded within the display memory by a unique series of data samples within the memory bank, and particularly, a series of a predetermined words such as zero. The display readout means is provided with a zero-word-detection means and a zero-counting means to control the display channel connection. In one embodiment, the zero-counting means includes output means indicating absence of an "0" and a pair of outputs, one of which is related to the predetermined number of "0", for changeover and the other, all other numbers of zero. The counting means is cleared with the appropriate sync drives of the display. The three control lines are connected to an "ANDED" Network connecting the output of the line segment definition circuit to the channel drivers to present the data in either of a pair of output channels.

The present invention provides an improved graphical presentation of a line segment display and particularly the resolution of the graphical display.

BRIEF DESCRIPTION OF DRAWINGS

The drawings furnished herewith illustrate the best mode presently contemplated by the inventor for carrying out the subject invention in which the above advantages and features are clearly disclosed as well as others which will be readily understood from the following description of the embodiments shown.

In the drawings.

DESCRIPTION OF THE ILLUSTRATED EMBODIMENTS

Figure 1:
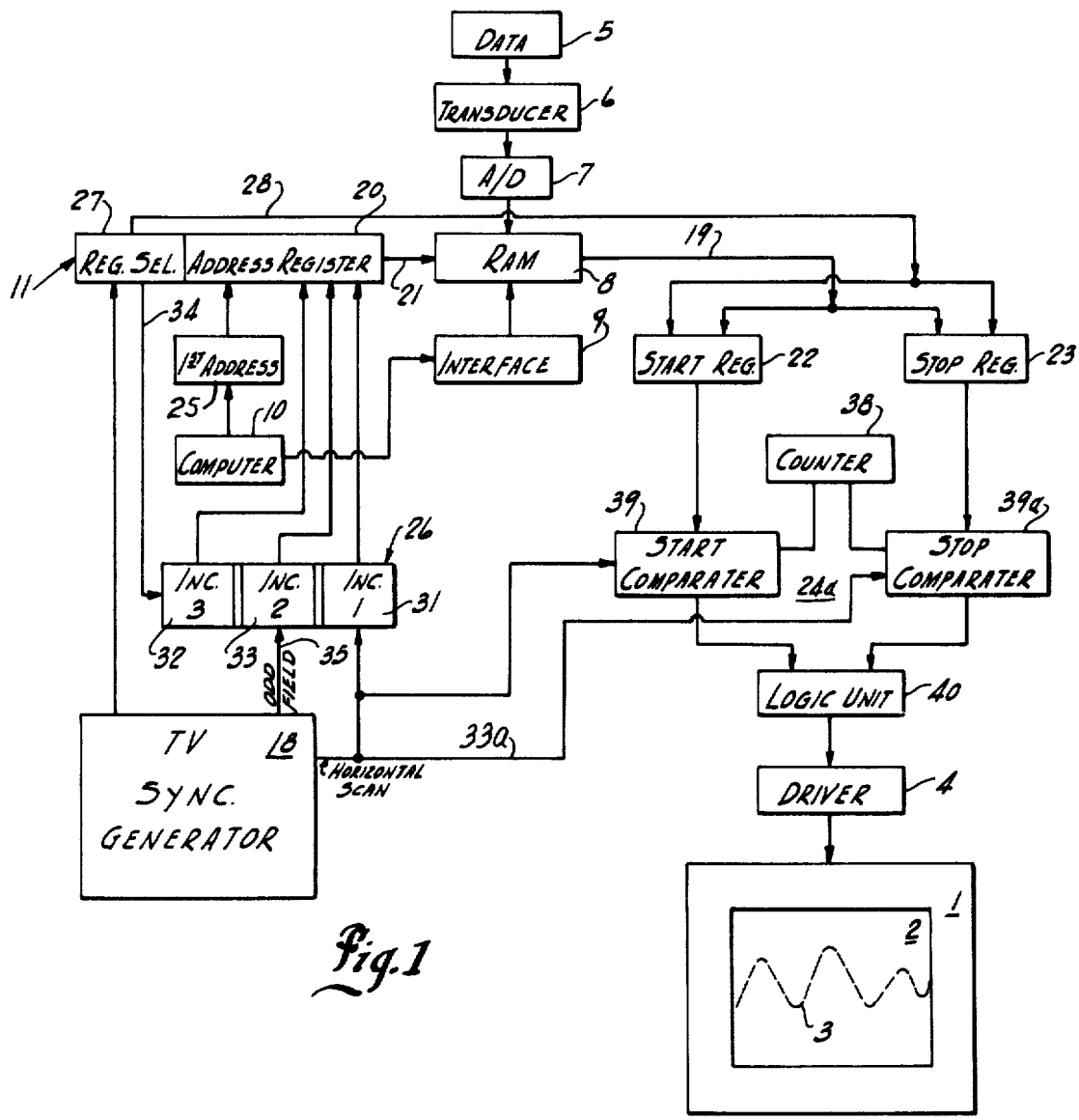
FIG. 1 is a simplified block diagram of a display system constructed in accordance with the teaching of the present invention.

Referring to the drawing and in particular to FIG. 1, the present invention is especially constructed to employ a conventional raster television set 1 as a display means and the set 1 is diagrammatically illustrated for display of monitored information on a tube or screen 2 such as industrial processes or controls, operating apparatus data, physiological data of a patient or the like. The present invention involves the presentation of data or information such as graphical form 3 on screen 2. The tube 2 is driven from a beam-on or driver control 4 which is connected to a signal source 5 which monitors a parameter and generates the data for waveform 3. Signal source 5 is shown connected to suitable transducer means 6 which convert a sensed parameter into predetermined analog voltage. The analog signal is coupled through an analog-to-digital converter 7 to a random access memory 8 which is coupled by an interfacing unit 9 to a computer 10 and display control 4 to produce the visual presentation 3 of the data.

Generally, the data source 5 is sequentially sampled and stored in the shared random access memory 8 under the control of a computer 10 which includes a suitable processor and program control, not shown. The analog-to-digital converter 7 is connected to the transducer 6 and converts each successive sample to an appropriate digital sample, which is stored in memory 8. The data is thus stored in sequential locations, sequentially readout to control the television beam-on control 4 by suitable read out of a computer 10 and a sequence controller 11 coupled to the memory 10 for time spaced and computer controlled operation. The computer 10 may be a small digital mini-computer or microprocessor for sampling, storing and processing of the sampled data.

Figure 2:
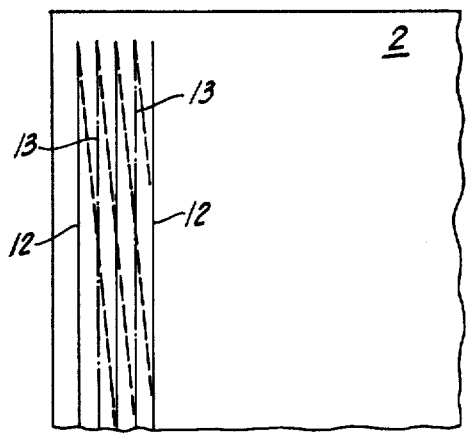
FIG. 2 is a fragmentary enlarged view of a display screen shown in FIG. 1 and illustrating a conventional raster screen beam movement.
Figure 3:
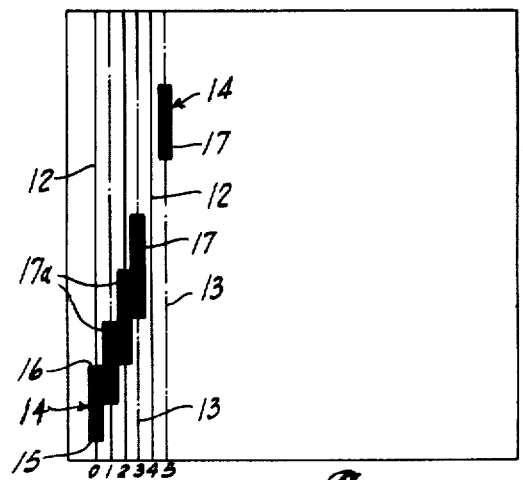
FIG. 3 is an enlarged illustration of a graphical display shown in FIG. 1.

The television beam is interlaced with the conventional odd-and-even scan lines 12 and 13 forming corresponding frames through the conventional suitable synchronizing control. A small expanded portion of line 12 and of line 13 is shown in FIG. 2. The display screen 2 is re-oriented by ninety degrees from the conventional position such that the horizontal scan lines 12 and 13, in fact, are vertically oriented, as shown in FIGS. 2 and 3. The graphical display is generated by forming of line segments 14, shown as heavy portions on scan lines 12 and 13, with only the starting coordinate 15 and the final point or coordinate 16 determined, with the beam being held on therebetween. In accordance with the present invention, the line segments 14 are uniquely generated with the lines of each frame spaced as at 17 and the segments of alternate frames partially overlapping as at 17a, with each line segment spanning or incorporating a plurality of data points, as hereinafter described. The data is stored as sequential samples in a sequential order of locations within memory 8. Thus, if a 1024 memory is employed, a corresponding number of data samples are taken to fill the memory. By sequential addressing of the memory locations, the data is retrieved for presentation on screen 2. Generally, the prior art memory is sized to the number of scan lines for providing the same number of data points. In the present invention, the memory is selected to store at least twice the number of data points needed for number of scan lines and the data is withdrawn from spaced, rather than adjacent data locations, to develop the unique overlapped visual presentation shown most clearly in FIG. 3.

The data acquisition and display system may be constructed as more fully disclosed in the previously described application of Lawrence T. McQuire wherein an interfacing control is provided for a plurality of different channels, with the channels uniquely separated and distinguished by a special channel color driving means. For a detailed illustration and description of one construction suitable for use in the present invention reference may be made to such application and is only shown and described herein as necessary to fully explain the present invention. The sequence controller 11 is operated in synchronism with the scan lines 5 and 6 to sequentially load the graphical data for each line segment 14 and having an output which sequentially activates the beam-on control 4 to generate the line segments 14.

In operation, sequence controller 11 is coupled to the memory bank 8 to continuously and in proper sequence through internal sequence control means activate control 4 during each scan line 12 during the one frame and each scan line 13 during the alternate frame to generate related graphical display, such as shown more clearly in FIG. 3.

The sequence controller 11 is activated and controlled by the output of a television sync signal driver or generating unit 18 to transmit the shared memory data to the display processing system via a bus 19 in response to input address information from an address register 20 via bus 21.

The coupling of memory 8 to the display driver 4 is controlled by the computer 10 and the sequence controller 11 to selectively and sequentially establish the transfer of the information on a frame by frame and a line by line basis, with the computer 10 selecting the starting address and the sequence controller 11 then sequencing through appropriate equally spaced locations as hereinafter described.

Generally, the sequence controller 11 includes the memory addressing unit 20 to transfer data from memory 8 to a pair of storage registers 22 and 23 which receive and store the starting and stopping coordinates 15 and 16 for each line segment 14. A comparing or reading state 24a sequentially reads the stored information and activates a driver 4 to produce the preselected beam start snd stop. The television sync signal generator 18 generates the necessary synchronizing signals for proper timing of the sequence controller 11 for data transfer and the stage 24a for activating driver 4 in time relation to the generation of scan lines 12 and 13, generally as in the previously indentified application. Thus, a multiplexing system with suitable modifying circuitry such as shown in the latter application may be employed but such detail is not included herein for purposes of simplicity and clarity of explanation of the present invention.

More particularly, the address memory register 20 is diagrammatically illustrated having a first address unit 25 and a unique address increment or stepping unit 26 to specially sequence the memory addresses for withdrawing of start and stop data from spaced memory locations within memory 8. The first address unit 25 is a presettable, latch unit driven from the computer 10 for automatic movement of the display across the screen 2, positioning on the screen and the like.

Control registers 22 and 23 for storing of the data identifying the beginning point 15 and the terminal point 16, respectively, for a line segment 14 is withdrawn from the shared memory 8 via bus 19. Registers 22 and 23 may be coupled through a pair of related buffer registers, not shown, which are loaded during a scan line drive under the control of the sequence controller 11. A register select unit 27 of sequence controller 11 is coupled by a bus 28 to sequentially activate the registers 22 and 23 during the loading cycle to store the line segment data. The coordination and synchronism between the display 1 and the memory 8 is controlled by providing data transfer and register selection and output in proper synchronism with each other in response to signals from the television synchronizing signal generator 18.

The address increment unit 26 is driven to uniquely sequence the address memory 11 for each scan line 12 and 13 and transfer data in proper sequence to the registers 22 and 23 with the register selector 27 connected by line 28 to the registers 22 and 23 to properly switch therebetween registers.

In the illustrated embodiment, the computer 10 has priority demand for memory 8 and holds the processing system inactivated at the end of a line readout cycle for a selected period which is sufficiently great to permit the computer fetch cycle, after which the processing system is again released and will proceed with the next line. Thus the computer time requirement is always sufficiently short, and the anticipatory time is sufficiently great to permit the desired sequencing with the display means momentarily held in an interrupted state. The computer will complete a "fetch" or communication readily within the line retrace time of the beam with the data transfer also completed information is transferred to registers 22 and 23 at the end of each scan line 12 or 13.

The actual information transfer to the beam-up control 4 is controlled by detecting the digital output of register 22 to turn-on the scanning beam and detecting the output of register 23 to turn-off the beam and thereby generate one line segment 7, for example, as in the previously identified copending application. The registers 22 and 23 are then updated for the next scan line 5 during the blanks and retrace time and the cycle is repeated. During each line generating cycle, the memory address unit 20 is operated to update the memory selection and may place the new data in an appropriate buffer.

In a practical embodiment, a memory bank of 1024 locations may be used and identified by numbers 0-1023. The data in such locations is identified by $X_O$ through $X_{1023}$, the sequence for acquiring and displaying the data is in a preferred construction as follows.

As previously discussed, a processing graphical representation is often employed wherein the newest data is placed on the right edge of screen 2 and the waveform 3 marches across the screen from left to right. The proper location is addressed by the addition of the constant 120 which placed the newest sample to the right edge during each scan.

The data is sampled by the computer 10 during the display periods with the retrace periods employed to load the registers 22 and 23 for the next line segment.

More particularly, the sequence controller 11 includes the address increment driver or unit 26 which is illustrated including the three different incrementing level drivers 31, 32 and 33 for stepping of the address register by memory address location of 1, 2 and 3 respectively. Driver 31, which increments register 20 to the next sequential address, is connected to the horizontal retrace sync line 33a of the sync generator 18. Thus, line 33a provides a signal at each horizontal retrace between the adjacent scan lines 5 and adjacent scan lines 6. Thus, between each retrace, the next data point or location is addressed and the data placed in the start point register 22. Driver 32, which increments register 20 to the third sequential address, is connected, as shown by line 34, to the register select unit 27, which operates to toggle the address driver 32 to in turn increment the address register 20 by three to read the corresponding memory location as the ending data 16 for terminating the line segment 14. The horizontal retrace again sequences one to the next location or address and thereby initiates the formation of the next line segment 14, with the starting data 15 spaced by one data location from the terminal data 16 of the previous segment. Thus, in any given frame, the line segments 14 may be spaced, with the alternate frame generating line segments 14 which span the spacing and overlapping the line segments 14 of the previous frame as a result of the third driver 32.

The driver 33 is operable to increment the address register 20 by two addresses and is activated by an odd field sync line 35 from the sync source 18. Thus, at the start of the odd field or frame generator, the computer 10 loads the address register 20 with the most current sample and then increments the counter by two to select the address offset from the starting point of the even frame field by two and providing an initial overlap with the first line segment 14 of the even frame. Generally, four new samples are taken during a previous display sequence. The reset of memory is presumed filled with data taken previously. If the previous sample was stored in location 1021, the four new samples are stored in $X_{1022}$ in location 1022
$X_{1023}$ in location 1023
$X_0$ in location 0
$X_1$ in location 1

Assume an even field vertical drive time, the computer 10 loads the Address counter or address register 20 of the sequence controller 11 with the address of location 1 as the last sample taken was placed in location 1. At horizontal drive, increment unit 31 is activated and steps the register once to access a starting point at location 2 and stores the data in the start point register 22. The register select 27 toggles the increment unit 32 and steps the address register three locations.

During this display sequence four more samples have been taken by the computer 10 with a Sample and store $X_2$ in location 2
$X_3$ in location 3
$X_4$ in location 4
$X_5$ in location 5

The computer 10 then performs an output operation which loads the address of the last sample of locations 5 plus the constant 120 plus 2 into the address counter and register 20 of the line segment generator or sequence controller 11. At horizontal drive, the counter is again stepped once and the start point for line 6 accessed. The counter is stepped three times and accessed. This continues for all horizontal drives.

The result in a graphical representation such as shown in FIG. 3 wherein the even frame lines 12 includes segments 14 which are offset by the factor of two addresses from the segments 14 of the odd frame lines 13, as determined by the offset increment unit 33. Each segment spans a plurality of four data locations as a result of the span increment unit 32 and thus includes a portion of the data of the adjacent opposite frame line. Each line segment 14 thus includes two pieces of unique data and the 512 scan lines provided by the even and odd frames, in fact, includes and displays twice the number of data points or the total of the 1024 data locations of memory 8.

As in the previous application, comparator 24a includes a counter or register 38 which is reset at the beginning of each scanning line, for example, as a result of the horizontal blanking signal of the sync generator 18. The output of the counter 38 and the outputs of registers 22 and 23 are compared in a continuous manner through related digital signal comparators 39 and 39a which are combined in a logic unit 40. The output of the logic unit 40 activates the beam driver 4 for producing the selected line segment 14.

Figure 4:
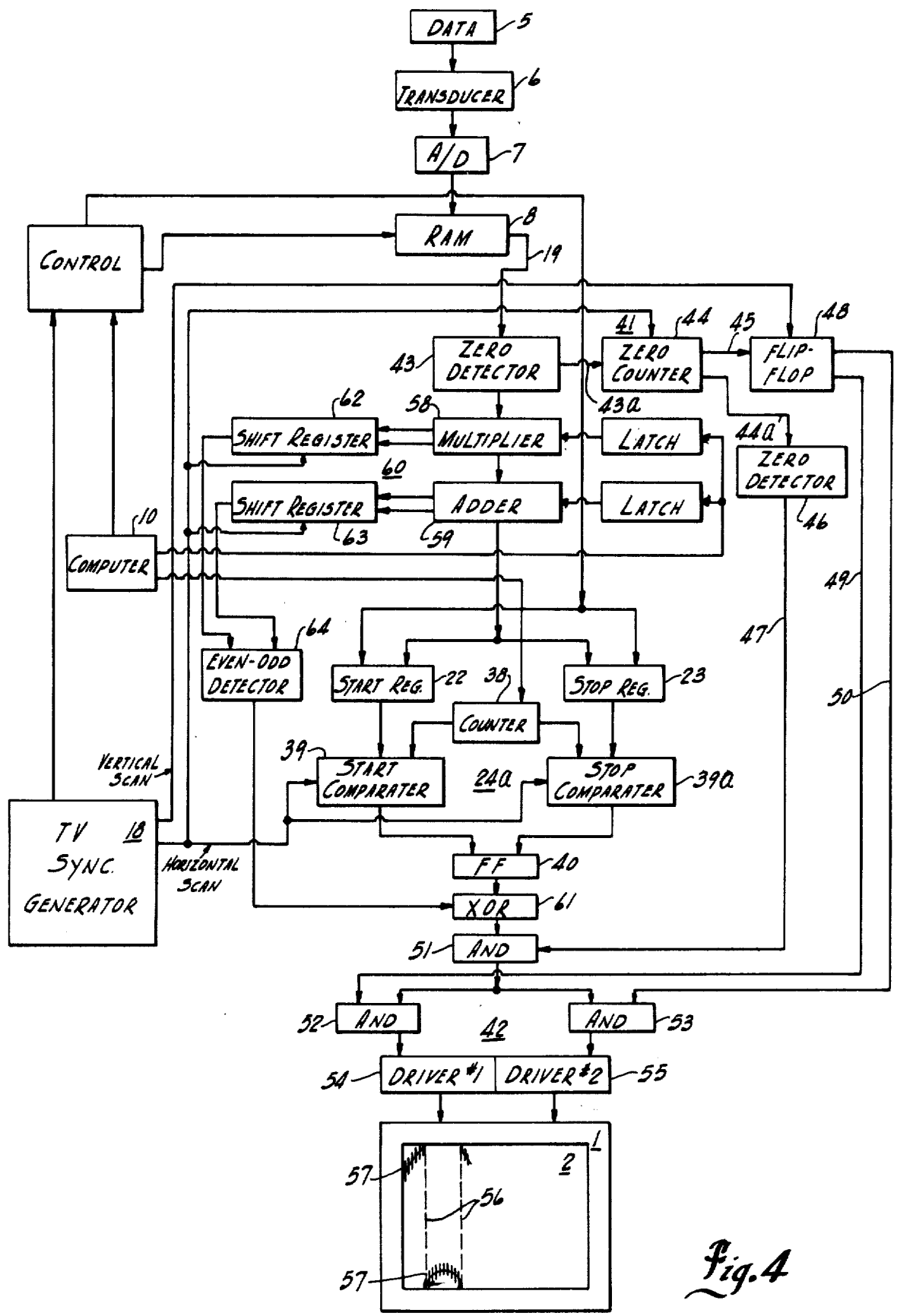
FIG. 4 is a block diagram illustrating means for controlling of the display.

In FIG. 4, a modified control is illustrated which prevents display of erroneous data and erroneous display of off-scale data as well as providing a unique data routing control. The display control may include the line segment control of FIGS. 1-3 and is shown in block diagram in FIG. 4.

In FIG. 4, a channel routing control includes a digital sample word monitor section 41 connected to control a routing section 42 connecting the output of the comparator stage 24a to the driver. The monitor section 41 is constructed to detect a unique sequence of samples indicating a desired change in the routing of the display. In the illustrated embodiment, the unique sequence is a predetermined number of zero sample words which in the illustrated embodiment is 2. The system is designed such that the A/D converter 7 never introduces a zero data word. Computer 10 is operable to load memory locations with zero words. Alternate zero words are detected to blank the display and sequence of zero words are detected to change the display as follows.

More particularly the monitor section includes a zero detection means 43 to detect and transmit the samples and also to provide an output at a line 43a whenever a zero word is detected. The output is connected to activate a counter 44 having a non-zero putput line 44a and a two or overflow-count output line 45. Line 44a is coupled to a zero detector 46 and provides a first control line 47 which is operative when a zero is not present. The zero output line 45 is connected as the input to a flip-flop unit 48. The two output provides a pair of opposite binary level output signal lines 49 and 50 in accordance with the number of zero words detected in sequence. The flip-flop unit 48 is cleared on vertical drive at the starting of each new frame, and the zero counter 46 is cleared at each horizontal drive. The three output lines 47, 49 and 50 are connected to control the routing section 42 which includes three, two-input "AND" circuits or logic units 51, 52 and 53 connected in a tree configuration. The "AND" gate 51 is connected to the output of the start-stop comparator section 24a and has a second input connected to the zero detector output line 47 of the monitor section 41. The second and third "AND" logic units each have a first input connected to the output of the first "AND" unit and their second input connected respectively to the output lines 49 and 50 of the flip-flop unit 48. The output of the "AND" units 52 and 53 are connected to different channel driver 54 and 55 for selectively displaying of the stored data.

In the absence of any zeros, the system operates in a normal manner to display the graphical data stored in memory unit 8. If a change in the display is desired, the computer loads consecutives memory locations with zero data word indicating the desired change in the graphical display. In the illustrated embodiment, the monitor section 41 actuates the flip-flop unit 48 to automatically change channels. In a color system, the channel change may merely result in a change in the color of the graphical display following the unique zero detection.

If the computer loads alternate memory locations with zeros, the output of zero detector 46 actuates the first "AND" logic unit to blank the display as long as the alternate zero loading is read.

The monitor section 41 in combination with the routing control 42 thus provides a simple, reliable and inexpensive means for controlling the graphical display.

Further, as previously noted in a line segment display system with a wrap around or truncated sequential memory and an expansion means may create a split display data. Thus, if the display moves off the top of the screen, the off-scale reading appears as a location on the bottom of the screen. However, with conventional line segment generator, erroneous line segment directly between two such points is developed such as shown at 56 in dotted trace in FIG. 4.

In the illustrated embodiment of FIG. 4, the system is constructed to eliminate such line and to generate the true data and graphical display on the upper and lower portions of the screen as at 57 in FIG. 4.

Referring particularly to FIG. 4, a multiplier unit 58 and an adder unit 59 are connected in series between the output of the memory unit 8 and particularly the zero detector 43 of the monitor section 41 and the input to the comparator stage 24a. The multiplier and the adder units 58 and 59 are loaded by the computer 10 to provide desired expansion of the graphical display and to control the position of the display. In accordance with this aspect of the invention, a carry bit monitor section 60 is connected to the carry bit output of the multiplier and the adder units and provides an output for controlling a complementing circuit 61, connected in the output between the comparator stage 24 and the driver, connection circuitry which in FIG. 4 includes the "AND" circuitry.

More particularly, in the illustrated embodiment of the invention, a two bit shift register 62 is connected to the carry bit output of the multiplier unit 58. A similar shift register 63 is connected to the carry bit output of the adder unit 59. The output of each shift register 62 and 63 is a pair of lines connected to an even-odd detector unit 64. The shift registers 62 and 63 have clear lines connected to the sync generator 18 to clear both of the shift registers on each horizontal retrace. Each line segment thus has up to four carries. If an even carry output exists, the display is such as to have a single data output or a line segment which extends from the one edge of the screen as to if to be reconnected to the bottom to a data point spaced from the first point. An enable output signal is established by the even-odd detector 64 which is connected to activate the complementing circuit unit 61.

In the illustrated embodiment of the invention, circuit 61 is an exclusive "OR" logic unit connected between the output of the comparator stage 24a and the first "AND" unit 51 of the routing section. When activated, the logic unit 61 actuates the driver section to turn the scanning beam for all portions of actual data and eliminates the erroneous line segment directly joining the two data points.

Thus, two data points exist with the line segment moving off the screen and returning at the bottom of the screen, the graphical display is drawn accordingly with the graph moving to the upper edge and a continuation of the graphical display appearing on the lower portion of the screen as at 57. There will be no line 56 directly between the points such as in on more conventional line segment generator.

If there is a single data point indicating no line is to be drawn, the output blanks the graphical display to avoid development of a line from such point to the bottom of the display screen.

This results in a further improved display of the line segment display system. The logic circuit employs readily available components which may be incorporated into the unique overlap line segment display of this invention as well as other line segments display devices such as shown in the properly identified in the pending application of Lawrence E. McGuire. Further, the system provides low cost apparatus which operates at high speed to properly process the data and control the display driver for the scanning beam.

Various modes of carrying out the invention are contemplated as being within the scope of the following claims, particularly pointing out and distinctly claiming the subject matter which is regarded as the invention.

I claim:

1. In a raster type display apparatus having a scanning beam adapted to be turned on and off and a digital memory means including a plurality of storage locations and having a sample and digitizing means for conversion of a live waveform signal into a series of time spaced digitized data and addressing means for placing of live waveform digitized data in said storage locations, said addressing means being repetitive and replacing old waveform digitized data with new digitized data to permit a capture of a continuing live waveform and said data being stored as encoded data values with sequential locations defining sequential portions of the waveforms, and said data values defining start and stop data for generating a line segment display on a display tube means, comprising an interleaving scan line driver means developing sequential display frames each of which includes a plurality of scan lines of the scanning beam, with sequential frames offset to interleave the scan lines of sequential frames, display control means including addressing means for addressing said storage locations and reading means for reading said memory means for obtaining the start data and the stop data, said control means including means utilizing the start data value for determining the proper location of beam turn-on to control turn on of the display at the position within the display tube means in accordance with the start data and utilizing the stop data value for determining the proper location of beam turn-off to control turn off of the display beam at the position within the display tube means in accordance with the stop data for reproducing the portion of the waveform and connected to said driver means for developing said line segments for each scan line in said display, and said display addressing means including data location selection means to increment the memory storage location being read for stop data by a first preselected number of storage locations from the location of the start data whereby during each line the starting location and stopping location are separated by more than one sequential data location, said data location selection means incrementing the start data location of alternate frames by a second preselected number of locations less than said first preselected number to locate the starting point of successive line segments in accordance with the data value of the starting location and between the starting and stopping points of the adjacent line segments of the interleaved frames and thereby forming a line segment waveform of the continuous waveform data with adjacent line segments overlapped, the degree of overlap varying with and controlled by the data values of the storage locations.

2. In the raster type display apparatus of claim 1 wherein said digital memory means includes memory locations equal to a multiple of the total scan lines per interleaved frames, said means for reading of said memory means is operable to read spaced memory locations in accordance with the number of frame scan lines and total number of member locations, said means to offset the line segments of selected interleaved frames being selected with an offset equal to one-half of the number of memory locations in each line segment.

3. The display apparatus of claim 1 wherein said display means includes a pair of frames for each complete scan including alternate even and odd frames with a preselected number of scan lines and said digital memory means includes storage locations equal to at least two times the total number of scan lines with sequential stored data samples for generating said line segments.

4. The display apparatus of claim 1 including a sync generator sequentially developing even and odd display frames with a like plurality of scan lines, said addressing means of said control means having a memory address register means, means for loading a starting line address in said register, said selection means having incrementing means for incrementing said register by steps of one, two and three, said display addressing means being connected to increment said register by two at the start of each of one of said pair of frames, means to increment the register by one at the start of each scan line and to transmit starting point data to said control means and by three after the increment by one and storage of the starter point data to transmit stop point data to the control means.

5. The display apparatus of claim 4 wherein said incrementing means adds a constant to each address to place the newest sample to the right edge of the display means and generates a display moving from right to left across said screen.

6. The raster type display apparatus of claim 4 having a computer means connected to said digital memory means and to said address register means, said computer being operable to load said register means with the address location of the latest sample placed in storage.

7. The display apparatus of claim 1 wherein said display means includes a pair of frames for each complete scan including alternate even and odd frames with 512 scan lines and said digital memory means includes 1024 storage locations with sequential stored data samples for generating said line segments, a sync generator sequentially developing the even and odd display frames with a like plurality of scan lines, said means utilizing the start and stop data including start point storage means and stop point storage means, said reading means for reading of said memory means including a sequence controller having a memory address register means, said addressing means loading a starting address in said register means, said selection means having incrementing means for incrementing said register by steps of one, two and three and being connected to increment said register by two at the start of each one of said pair of frames and to increment the register by one at the start of each scan line and to transmit starting point data to said start point storage means of said means utilizing the start data by three after the increment by one and the storage of the start point data in said storage means to transmit stop point data to the stop point storage means of said means utilizing the stop data.

8. The raster type display apparatus of claim 6 having a computer means connected to said digital memory means and to said address register means with the address location of the latest sample placed in storage.

9. The display apparatus of claim 1 wherein said storage locations are equal to twice the number of total scan lines in each sequential pair of frames, successive storage locations containing sequential stored data samples and being read for generating said line segments, said driver means including a line segment means connected to turn the display means on and off during each scan line, said display control means including a sequence controller having a memory address register and connected to actuate said driver means in accordance with the data samples in said memory means, computer means for loading a starting address in said register, incrementing means for incrementing said register by steps of one, two and three means connected to increment said register by two at the start of each of one of said pair of frames, and means to increment the register by one at the start of each scan line to transmit starting point data to said driver means and then by three to transmit stop point data to the line segment means.

* * * * *